US011328947B1

(12) United States Patent
Tan et al.

(10) Patent No.: US 11,328,947 B1
(45) Date of Patent: May 10, 2022

(54) ALIGNER APPARATUS AND ALIGNMENT METHOD

(71) Applicants: KAWASAKI JUKOGYO KABUSHIKI KAISHA, Kobe (JP); Kawasaki Robotics (USA), INC., Wixom, MI (US)

(72) Inventors: Haruhiko Tan, Kobe (JP); Hajime Nakahara, San Jose, CA (US); Shota Tominaga, Santa Clara, CA (US); Hiroyuki Yoshida, San Jose, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 0 days.

(21) Appl. No.: 17/158,973

(22) Filed: Jan. 26, 2021

(51) Int. Cl.
*H01L 21/68* (2006.01)
*H01L 21/687* (2006.01)
*B65G 47/90* (2006.01)

(52) U.S. Cl.
CPC .......... *H01L 21/681* (2013.01); *B65G 47/905* (2013.01); *H01L 21/68707* (2013.01); *B65G 2203/0233* (2013.01); *B65G 2203/044* (2013.01)

(58) Field of Classification Search
None
See application file for complete search history.

(56) References Cited

U.S. PATENT DOCUMENTS

| 7,949,425 | B2* | 5/2011 | Mitchell | H01L 21/67745 |
| | | | | 700/218 |
| 11,139,190 | B2* | 10/2021 | Bergantz | H01L 21/68 |
| 2002/0005168 | A1* | 1/2002 | Kraus | H01L 21/67184 |
| | | | | 118/715 |
| 2002/0070095 | A1 | 6/2002 | Osaka et al. | |
| 2008/0138178 | A1* | 6/2008 | Ferrara | C23C 14/48 |
| | | | | 414/757 |

FOREIGN PATENT DOCUMENTS

| JP | 3988317 B2 | 10/2007 | | |
| JP | 4255091 B2 | 4/2009 | | |
| JP | 2012084802 A | * 4/2012 | ....... H01L 21/67265 |
| KR | 2017120347 A | * 10/2017 | ........... B65G 47/902 |

* cited by examiner

*Primary Examiner* — Gerald McClain
(74) *Attorney, Agent, or Firm* — Metrolex IP Law Group, PLLC (57) ABSTRACT

An aligner apparatus according to one or more embodiments may include a first rotating base, a second rotating base, and a detection apparatus. The first rotating base on which a wafer placed thereon rotates around a first rotation axis line. The second rotating base on which a wafer placed thereon rotates around a second rotation axis whose position is different from that of the first rotation axis line. The detection apparatus includes one sensor for detecting the edge of the wafer, and the detection range of the sensor includes the edge of the wafer placed on the first rotating base and the edge of the wafer placed on the second rotating base, and detects the edges of the two wafers.

8 Claims, 6 Drawing Sheets

ALIGNER APPARATUS AND ALIGNMENT METHOD

TECHNICAL FIELD

The present invention relates mainly to an aligner apparatus for performing a wafer alignment.

BACKGROUND ART

An aligner apparatus is provided in a facility where handling wafers (e.g., semiconductor processing factory). The aligner apparatus performs alignment which adjusts to acquire the rotation phase of the wafer. Patent Document 1 (U.S. Pat. No. 4,255,091) and Patent Document 2 (U.S. Pat. No. 3,988,317) discloses a device which performs alignment of a plurality of wafers.

A wafer positioning device in PTL 1 includes a plurality of support pins, a motor, and a plurality of optical sensors. The plurality of support pins is arranged in the vertical direction. Each support pin supports the wafer. The motor rotates the wafer supported on the support pins collectively. The optical sensor is arranged near the edge of the wafer supported by the support pins. The optical sensor detects an orientation flat or a notch of the wafer while rotating the wafer. Therefore, the wafer positioning device can perform alignment for a plurality of wafers all together.

In the wafer arraying device in PTL 2 performs alignment of a plurality of wafers by using one optical sensor. The plurality of wafers are arranged formed in the pre-alignment position first. The wafer arraying device rotates the wafer to an angle at which the light beam of the optical sensor passes through the notch of the wafer, after one of the wafers in the position before alignment is moved to the position after alignment. By performing this operation on all the wafers, perform alignment on a plurality of wafers by using one optical sensor.

SUMMARY OF INVENTION

Technical Problem

In the apparatus in PTL 1, a sensor is provided for each wafer to be aligned. Therefore, the cost of the aligner apparatus will increase. In the device in PTL 2, as a result, the cost of the aligner apparatus increases due to the complicated configuration, because of a mechanism for moving a wafer from the position before alignment to the position after alignment is needed.

The present invention has been made in view of the above circumstances, and a main object thereof is to provide an aligner apparatus for performing alignment on a plurality of wafers at a low cost.

Solution to Problem

Problems to be solved by the present invention are as described above. Solutions to the problems and advantageous effects thereof will now be described.

A first aspect of the present invention provides an aligner apparatus configuration as follows. That is, the aligner apparatus includes a first rotating base, a second rotating base, and detection device. The first rotating base is rotated with a wafer placed thereon around a first rotation axis line. The second rotating base is rotated with a wafer placed thereon around a second rotating axis whose position is different from that of the first rotation axis line. The detection device includes one sensor which detects the edge of the wafer, and the detection range of the sensor includes the edge of the wafer placed on the first rotating base and the edge of the wafer placed on the second rotating base, and detects the edges of these two above wafers.

A second aspect of the present invention provides an alignment method as described below. That is, the alignment method includes a first detection step and a second detection step. In the first detection step, the sensor detects the edge of the wafer placed on the first rotating base that rotates around the first rotation axis line. In the second detection step, performing simultaneously as the first detection step or after the first detection step, and the position of the sensor is the same as that of the first detection step, the sensor detects the edge of the wafer 2 placed on the second rotating base that rotates around the second rotation axis line different from the first rotation axis line.

Effects of Invention

According to the present invention, an aligner apparatus for performing alignment on a plurality of wafers at a low cost may be realized.

DESCRIPTION OF EMBODIMENTS

Figure 1:
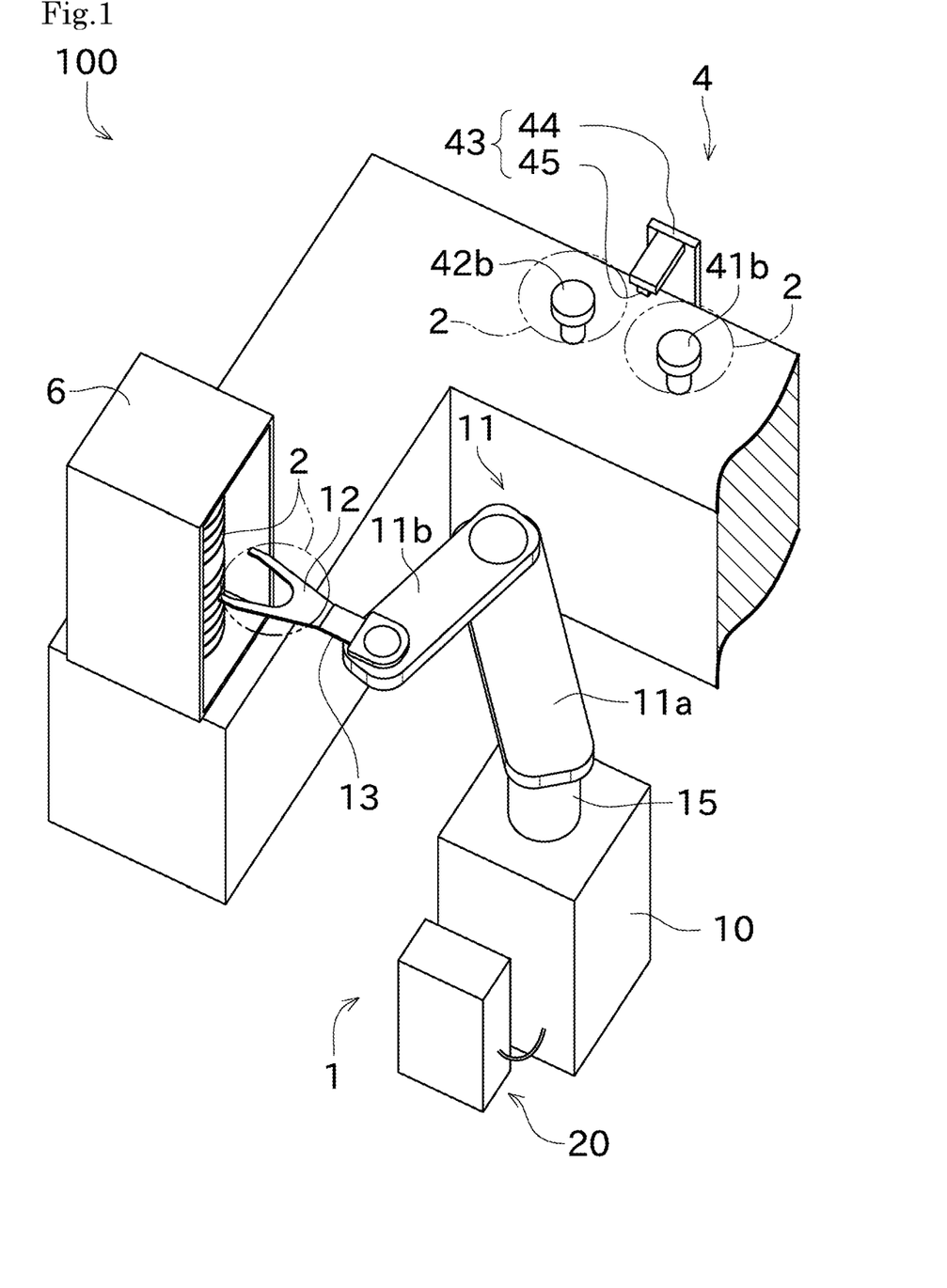
FIG. 1 is a perspective view showing a configuration of a robot system includes an aligner apparatus according to an embodiment of the present invention.

Next, an embodiment of the present invention will be made based on the drawings. FIG. 1 is a perspective view showing the configuration of a robot system 100.

The robot system 100 shown in FIG. 1 is a system that makes a robot 1 to perform operation in work space such as a clean room. The robot system 100 includes a robot 1, an aligner apparatus 4, and a controller 20.

The robot 1 is a wafer transfer robot for conveying a wafer 2 stored in a storage device 6, for example. In this embodiment, the robot 1 is achieved by a SCARA type horizontal articulated robot. SCARA is an abbreviation for Selective Compliance Assembly Robot Arm.

A wafer 2 conveyed by the robot 1 is a semiconductor wafer. The wafer 2 is formed in a shape of a thin circular plate. The wafer 2 may be a glass wafer instead of the semiconductor wafer.

As shown in FIG. 1, the robot 1 includes a base 10, an arm 11, and a hand 12.

The base 10 is fixed to, for example, a floor of the factory. However, without being limited to this, for example, the base 10 may be fixed to an appropriate processing plant.

As shown in FIG. 1, the arm 11 is mounted to the base 10 via a lifting shaft 15 that can move in the vertical direction. The arm 11 can be rotated relative to the lifting shaft 15.

The arm 11 is a horizontal articulated type arm. The arm 11 includes a first arm 11a and a second arm 11b.

The first arm 11a is an elongated member extending in a linear shape arranged in horizontal. One end of the longitudinal direction of the first arm 11a is mounted to the upper end part of the lifting shaft 15. The first arm 11a is rotatably supported with the axis (vertical axis) of the lifting shaft 15 as the center. The second arm 11b is mounted to the other end of the longitudinal direction of the first arm 11a.

The second arm 11a is an elongated member extending in a linear shape arranged in horizontal. One end of the longitudinal direction of the second arm 11b is mounted to the end of the first arm 11a. The second arm 11b is rotatably supported with the axis (vertical axis) parallel to the lifting shaft 15 as the center.

The hand 12 is connected to the second arm 11b via a wrist unit 13. The wrist unit 13 is mounted to the end of the second arm 11b. The wrist unit 13 is rotatably supported with the axis (vertical axis) parallel to the lifting shaft 15 as the center. The wrist unit 13 is rotationally driven by an appropriate actuator (not shown). This actuator is, for example, an electric motor. The hand 12 is interconnected to the wrist unit 13.

The hand 12 is an edge grip-type hand having a branching structure. At each tip portion branched on the hand 12, an edge guide (not shown) is provided. A press member (not shown) is provided near the wrist unit 13. The press member can be slide along the surface of the hand 12 by an actuator (not shown) (e.g., pneumatic cylinder). By sliding the press member with the wafer 2 placed on the hand 12, wafer 2 can be held between the edge guide and the press member in such a manner as to sandwich it.

The hand 12 is not limited to the edge grip-type. The hand 12 may be a passive grip-type or an adsorption-type. The passive grip-type is a configuration in which a wafer placed on the hand is not fixed (configuration not having a press member). The adsorption-type is a configuration (for example, Bernoulli chuck) that the surface of the wafer 2 is sucked and can be conveyed with a negative pressure.

In this embodiment, one hand 12 is provided on the arm 11. Instead of this configuration, two or more hands 12 may be provided on the arm 11. For example, two hands 12 are provided at the tip portion of the second arm 11b of the arm 11. The two hands 12 can be rotated independently around the vertical axis. Consequently, for example, the robot 1 can be simultaneously conveyed two wafers 2.

Figure 2:
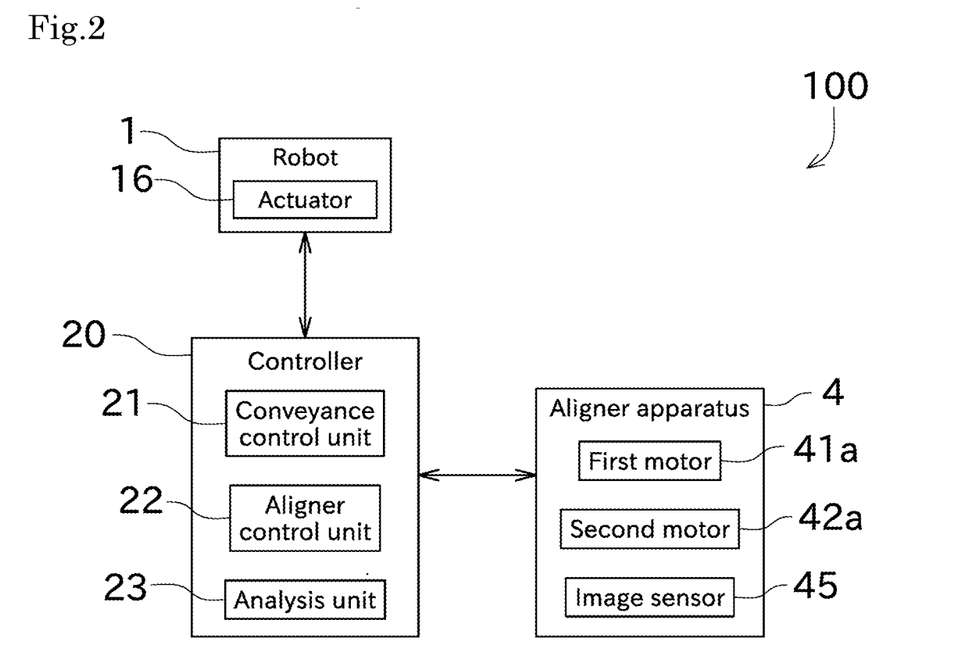
FIG. 2 is a block diagram of a robot system.

Each of the lifting shaft 15, the first arm 11a, and the second arm 11b is driven by an actuator 16 shown in the block diagram of FIG. 2. The actuator 16 is, for example, an electric motor.

In an arm joint unit located between the lifting shaft 15 and the first arm 11a, between the first arm 11a and the second arm 11b, and between the second arm 11b and the hand 12, an encoder (not shown) that detects each rotational position of the second arm 11b and the hand 12 are mounted. In addition, at an appropriate position of the robot 1, an encoder that detects a change in position of the first arm 11a in the height direction (that is, the lifting quantity of the lifting shaft 15) is also provided.

The controller 20 includes an arithmetic unit such as a CPU and a storage apparatus such as a HDD, a SSD, or a flash memory. The arithmetic unit can function as a conveyance control unit 21, an aligner control part 22, and an analysis unit 23 by executing the program stored in the storage device. The conveyance control unit 21 controls the robot 1. Specifically, the conveyance control unit 21 transmits a command value to the actuator 16, based on the registering working contents and the detection result of encoder for example. These conditions, the robot 1 performs the conveying operation of the wafer 2. The aligner control part 22 controls an aligner apparatus 4. The analysis unit 23 analyzes the detection result of the wafer 2 by the aligner apparatus 4.

In the present embodiment, the controller 20 controls the aligner apparatus 4 and the robot 1. Instead of this, a controller that controls the aligner apparatus 4 and a controller that controls the robot 1 may be separate.

The aligner apparatus 4 performs alignment which adjusts to acquire the rotation phase of the wafer 2. Specifically, a notch 2a is formed on the outer circumferential of the wafer 2. The notch 2a indicates the crystal orientation of semiconductor. The aligner apparatus 4 acquires the rotation phase of the wafer 2 by detecting the notch 2a, and adjusts the rotation phase of the wafer 2 by rotating the wafer 2 so that the notch 2a faces a predefined direction.

When an orientation flat is formed on the wafer 2 instead of the notch 2a, the aligner apparatus 4 may be configured to detect the orientation flat. Furthermore, in addition to the rotation phase of the wafer 2, the aligner apparatus 4 may be configured to acquire the positional deviation of the center position of the wafer 2 with respect to the reference point.

Hereinafter, the configuration of the aligner apparatus 4 is described with reference to FIG. 1 to FIG. 4. The aligner apparatus 4 includes a first motor 41a, a first rotating base 41b, a second motor 42a, a second rotating base 42b, and a detection apparatus 43.

Figure 3:
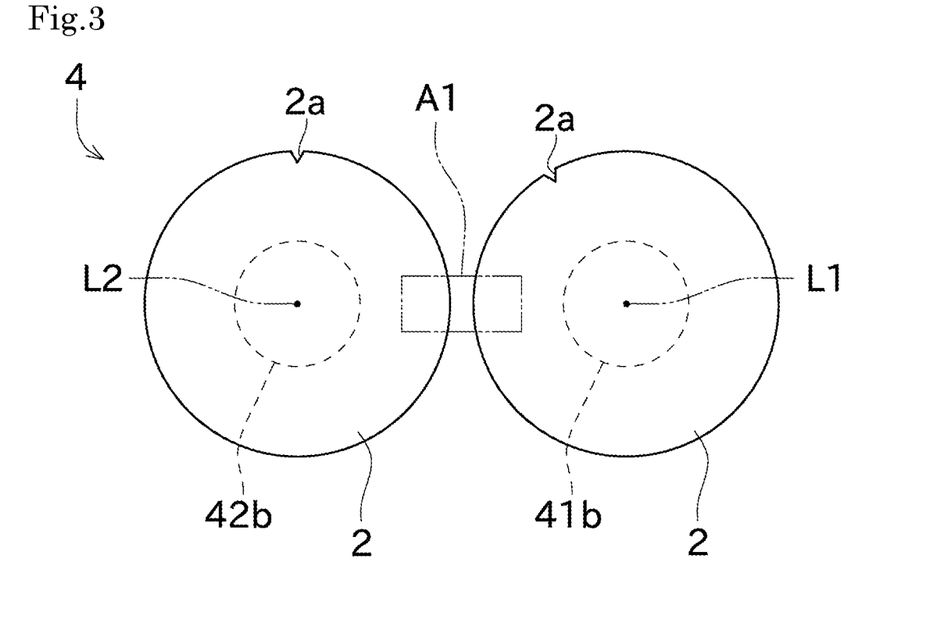
FIG. 3 is a plan view of an aligner apparatus.
Figure 4:
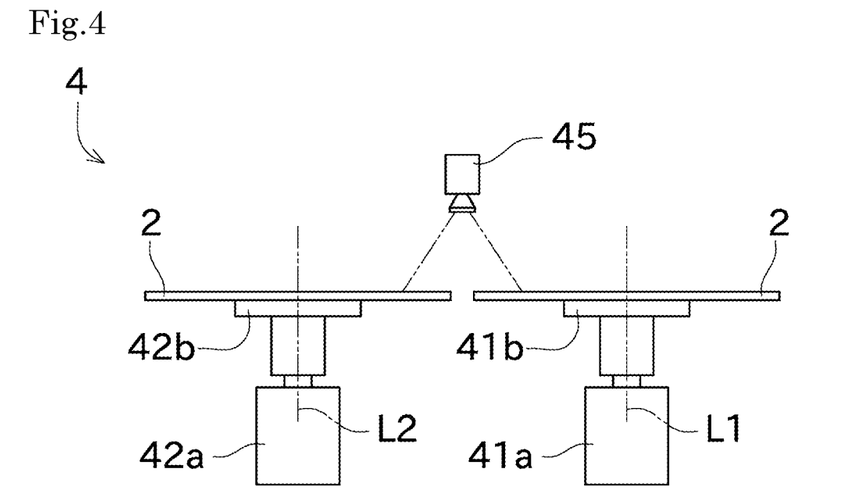
FIG. 4 is a side view of the aligner apparatus.

The first motor 41a is an electric motor, which rotates/stops according to a command from the aligner control part 22. The first motor 41a rotates by a rotation amount according to the command of the aligner control part 22. The driving force generated by the first motor 41a is transmitted to the first rotating base 41b via the transmission mechanism.

The first rotating base 41b is of a disk-shape and is arranged so as to face in the vertical direction. The wafer 2 is placed on the first rotating base 41b by a robot 1 and the like. The shape of the first rotating base 41b is not limited to a disk-shape. By transmitting the driving force of the first motor 41a, the first rotating base 41b rotates around the first rotation axis line L1.

The second motor 42a having the same configuration as the first motor 41a. The aligner control part 22 can rotate the second motor 42a independently of the first motor 41a. And thus, it is possible to rotate the second motor 42a after stopping the first motor 41a, and to make a different the rotation speed or rotation amount of the first motor 41a and second motor 42a.

The second rotating base 42b has the same configuration as the first rotating base 41b. The first rotating base 41b and the second rotating base 42b are arranged in the horizontal direction. Therefore, the positions of the first rotation axis line L1 and the second first rotation axis line L2 are also different. Specifically, in the plan view (FIG. 3 viewed in parallel with the first rotation axis line L1), the positions of the first rotating base 41b and the second rotating base 42b are defined so as to separate the wafer 2 placed on the first rotating base 41b and the wafer 2 placed on the second rotating base 42b. Typically, the size of the wafer 2 using in the aligner apparatus 4 and the position on which the wafer 2 is placed are defined in advance in specifications and the like. Consequently, it can be confirmed that the first rotating base 41b and the second rotating base 42b are in the above-described positional relationship without placing the wafer 2 on the aligner apparatus 4. The height (a position of the upper surface) of the portion of the first rotating base 41b on which the wafer 2 is placed and the height (a position of the upper surface) of the portion of the second rotating base 42b on which the wafer 2 is placed are the same. However, these heights may be different.

The aligner apparatus 4 includes an encoder (not shown) for detecting the rotation phase of the first rotating base 41b and the second rotating base 42b. The detection result of encoder is transmitted to the controller 20.

The detection apparatus 43 includes a fitting member 44 shown in FIG. 1 and an image sensor (sensor) 45.

The fitting member 44 is fixed at an appropriate position in the factory, for example, a table for supporting the storage container 6, or a floor of the factory. An image sensor 45 is mounted to the fitting member 44.

The image sensor 45 is located above the first rotating base 41b and the second rotating base 42b. The image sensor 45 acquires an image of the edge of the wafer 2 placed on the first rotating base 41b and the second rotating base 42b. The captured image by the image sensor 45 is transmitted to the controller 20. It should be noted that the image sensor 45 may be captured the wafer 2 from below.

As shown in FIG. 3, the detection range A1 which is the range for acquiring an image by the sensor 45 includes the edge of the wafer 2 placed on the first rotating base 41b and the edge of the wafer 2 placed on the second rotating base 42b. The detection range A1 includes a portion where the two wafers 2 are most approximated to each other. In other words, it is preferable that the detection range A1 includes the middle point of the virtual segment connecting the first rotation axis line L1 and the second rotation axis L2 in a plan view. This allows the width of the detection range A1 can be improved with a minimum, so that it is possible to acquire more precise image or employ an image sensor 45 at a low cost. In addition, if the edge of the two wafers 2 can be acquired, the positions of the detection range A1 may be different.

The image sensor 45 is, specifically, a CCD (Charge Coupled Device) sensor or a CMOS (Complementary Metal Oxide Sensor) sensor. For example, it is considered that the CCD sensor is employed when image with high quality is important, and the CMOS is employed when low cost is important.

The image acquired by the image sensor 45 is transmitted to the controller 20. By analyzing this image, the analysis unit 23 of the controller 20 determines whether the detection range A1 includes the notch 2a. Additionally, the analysis unit 23 may determine whether the detection range A1 includes the orientation flat. The analysis unit 23 may calculate the positional deviation of the wafer 2.

Figure 5:
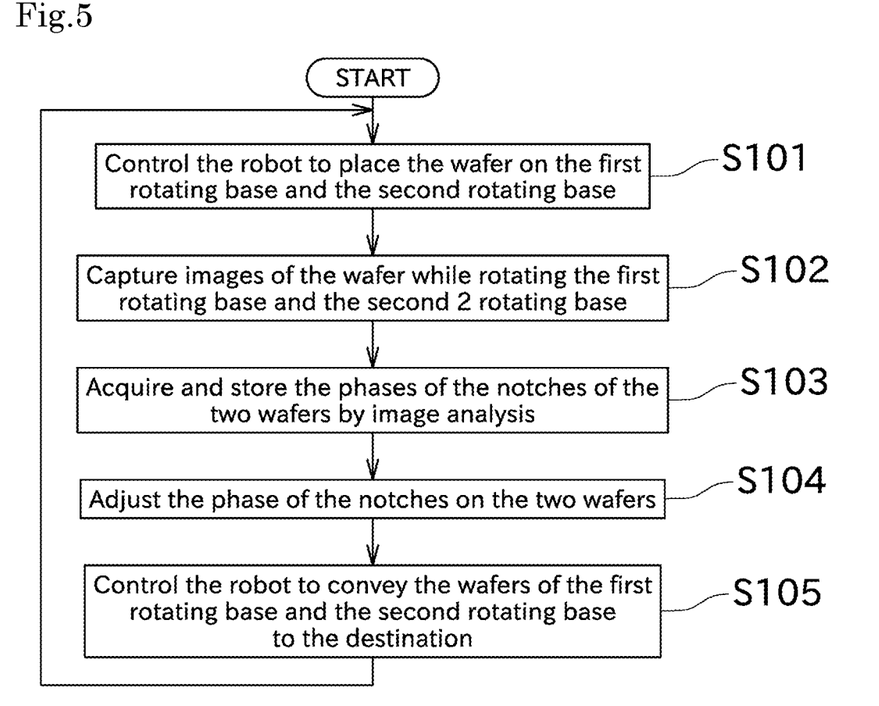
FIG. 5 is a flowchart showing the flow performing a wafer alignment.

And next, the work flow of performing alignment using the aligner apparatus 4 will be described with mainly referring to FIG. 5.

first, the conveyance control unit 21 controls the robot 1 to place the wafer 2 on the first rotating base 41b and the second rotating base 42b (S101). In addition, this operation may be performed by a robot different from the robot 1 (e.g., robot in the previous step).

Next, the aligner control part 22 controls the first motor 41a to rotate the first rotating base 41b, and controls the second motor 42a to rotate the second rotating base 42b (S102). Furthermore, the aligner control part 22 controls the image sensor 45 to capture the wafer 2 (S102). That is to say, the present embodiment, rotates simultaneously the two wafers 2 to acquire an image including the two wafers 2.

And next, the analysis unit 23 analyzes the image received from the image sensor 45, and acquires the rotation phases of the notches 2a of the two wafers 2 to stores them (S103). Specifically, the image received by the analysis unit 23 includes two wafers 2. For example, the wafer 2 that appears on one side of the central position of the image (In detail, one side in the parallel direction of the wafer 2) is the wafer 2 placed on the first rotating base 41b. The wafer 2 that appears on the other side of the center position of the image is the wafer 2 placed on the second rotating base 42b. Consequently, the analysis unit 23 specifies that one wafer 2 in the image is the wafer 2 placed on the first rotating base 41b, based on the position of the wafer 2 in the image. And next, the analysis unit 23 specifies the presence or absence of the notch 2a and the position of the notch 2a from the image. The analysis unit 23 acquires the rotation phases of the notch 2a of the wafer 2 placed on the first rotating base 41b, by specifying the rotation phase of the first rotating base 41b at the timing when the notch 2a is located at a predefined position in the image. Similarly, the analysis unit 23 acquires the rotation phase of the notch 2a of the wafer 2 placed on the second rotating base 42b. The above-described method is only an example, and can be changed as appropriate. In this manner, in the present embodiment, the rotation phases of the notch 2a can be collectively detected for the two wafers 2.

Note that the orientation flat can be specified by using the same method when the orientation flat is formed on the wafer 2. Further, when a positional deviation occurs at the center position of the wafer 2, the position of the edge of the wafer 2 in the image changes, so that the positional deviation of the center position of the wafer 2 can be specified, based on the change amounts in the position of the edge.

Next, the aligner control part 22 adjusts the rotation phases of the two wafers 2 (S104). To be specific, based on the rotation phase of the notch 2a specified by the analysis unit 23, the aligner control part 22 rotates the first rotating base 41b and the second rotating base 42b so that the notch 2a may be turned to a predefined direction. The aligner apparatus 4 can be simultaneously adjusted the rotation phase of the two wafers 2. However, the rotation phase of the wafer 2 may be adjusted one by one.

Next, the conveyance control unit 21 controls the robot 1 to convey the wafer 2 placed on the first rotating base 41b and the second rotating base 42b to the destination (e.g., processing device in the next step) (S105).

By performing the above processing, it is possible to perform alignment the two wafers 2 using one image sensor 45. In this result, the cost of the aligner apparatus 4 can be reduced as compared with the configuration for providing the sensor for each wafer. Particularly, in the aligner apparatus 4, the cost can be significantly reduced because of the cost of the image sensor 45 accounts for a high proportion. Furthermore, in the present embodiment, since the rotation phases of the two wafers 2 can be collectively acquired, the work efficiency of the alignment of the wafers 2 is high as compared with that of the configuration for operating alignment of the wafers 2 one by one. In addition, since it is not necessary to move the image sensor 45, the waste of time occurs are not caused from that viewpoint, the work efficiency is high and particles are not likely to occur.

Figure 6:
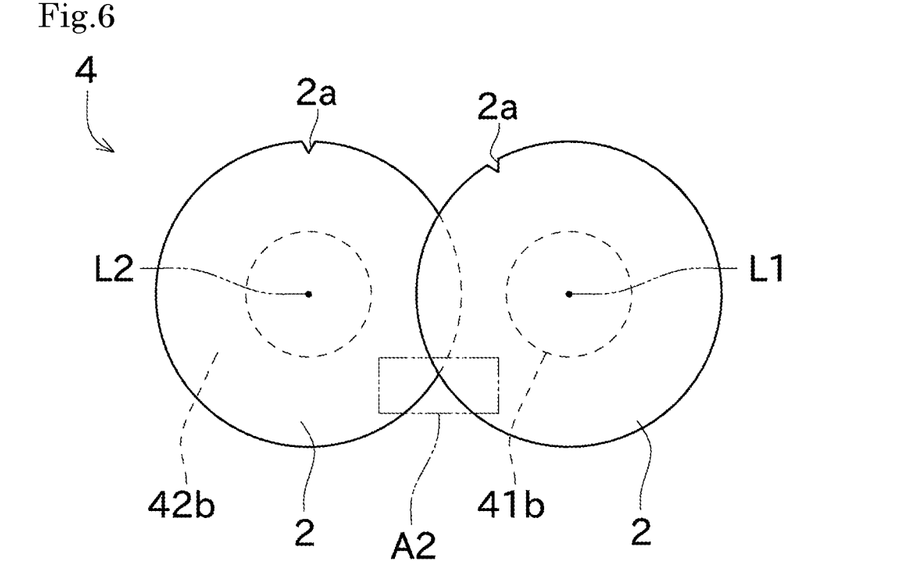
FIG. 6 is a plan view of an aligner apparatus in first embodiment of the present invention.

Next, the first embodiment will be described with reference to FIGS. 6 and 7. Further, in the description of the first embodiment and the later-described second embodiment, members that are the identical or similar as those of the embodiment described above are given the same reference numerals in the figures, and description thereof may be omitted.

According to the embodiment described above, the positions of the first rotating base 41b and the second rotating base 42b are defined so as to separate the two wafers 2 in a plan view. On the other hand, in the first embodiment, as shown in FIG. 6, the positions of the first rotating base 41b and the second rotating base 42b are defined so as to overlap the two wafers 2 in a plan view. It should be noted that the two wafers 2 are not overlapped completely but a part of the wafers 2 is overlapped with each other. In other words, the positions of the first rotation axis line L1 and the second rotation axis L2 are different. In the first embodiment, although the overlapping length of the wafers 2 is equal to or less than the radius of the wafers 2, the overlapping length may be greater the radius.

Figure 7:
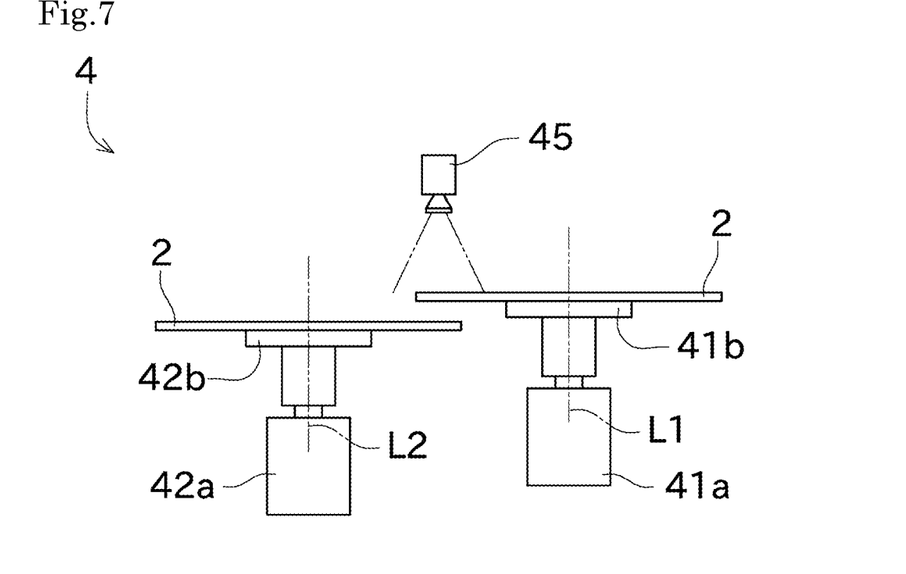
FIG. 7 is a side view of the aligner apparatus in first embodiment of the present invention.

Moreover, as shown in FIG. 7, owing to the wafers 2 overlap in a plan view, the height of the first rotating base 41b and the second rotating base 42b are different. Therefore, in the first embodiment, it is preferable that two robots 1 are provided, one robot 1 places the wafer 2 on the first rotating base 41b, and the other robot 1 places the wafer 2 on the second rotating base 42b.

The detection range of the image sensor 45 in the first embodiment is referred to as a detection range A2. In the embodiment described above, the detection range A1 includes a virtual segment connecting the first rotation axis line L1 and the second rotation axis L2 in a plan view. On the other hand, the detection range A2 is at a position offset in the vertical direction in a plan view from this virtual segment for including the edges of the two wafers 2 in the detection range A2.

The method for performing alignment using the aligner apparatus 4 of the first embodiment is the same as that of the embodiment described above. By employing the layout of the first embodiment, the installation area of the aligner apparatus 4 in a plan view can be reduced.

Figure 8:
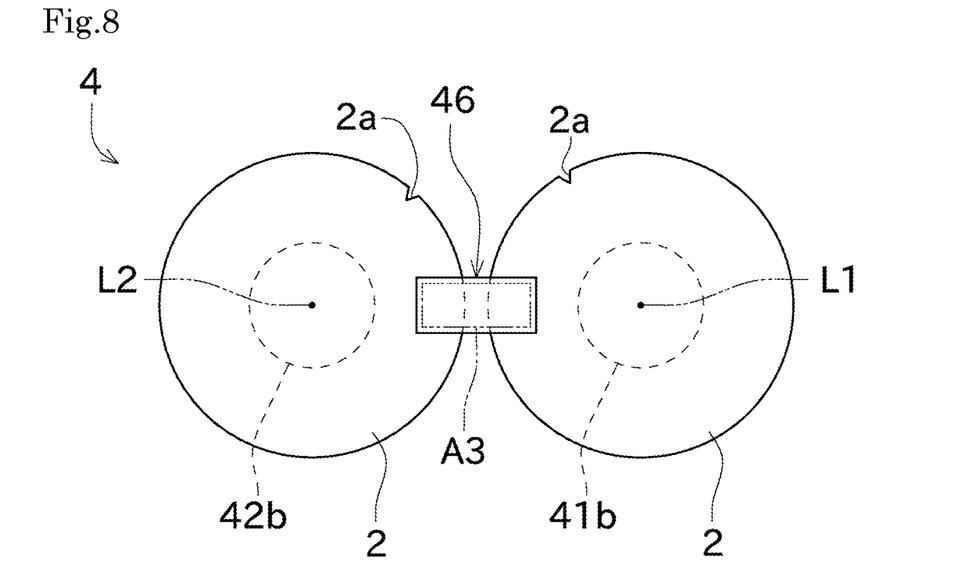
FIG. 8 is a plan view of an aligner apparatus in second embodiment of the present invention.
Figure 9:
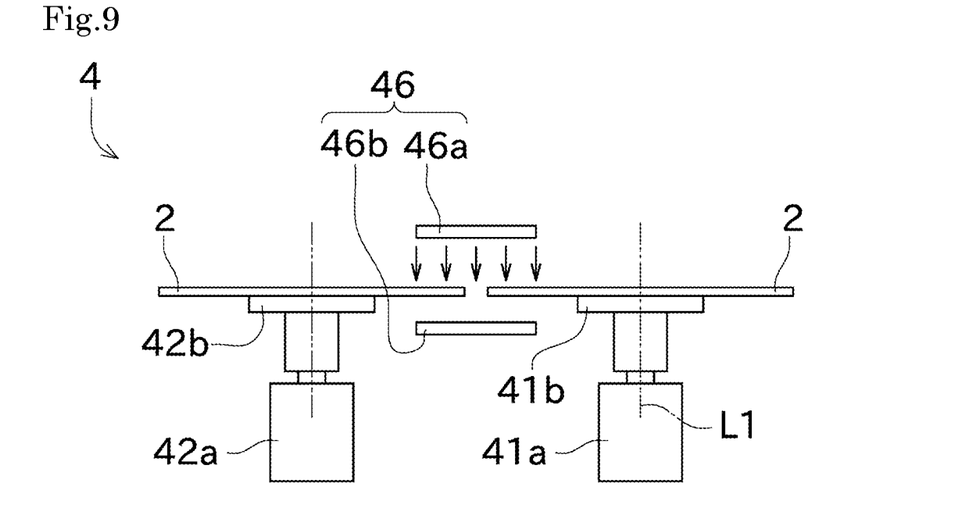
FIG. 9 is a side view of the aligner apparatus in second embodiment of the present invention.
Figure 10:
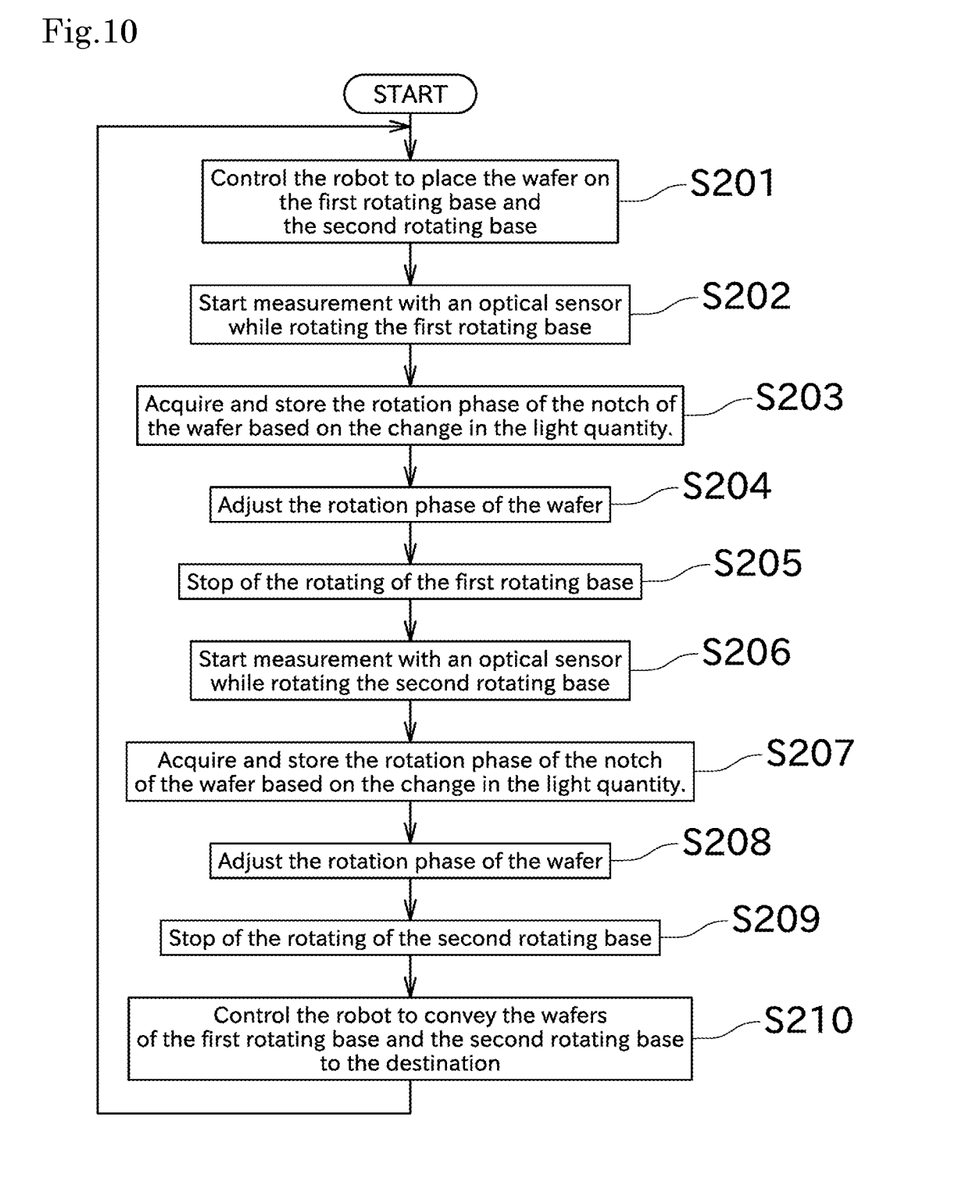
FIG. 10 is a flowchart showing the flow performing a wafer alignment in second embodiment of the present invention.

And next, a second modification will be described with reference to FIGS. 8 to 10.

In the second embodiment, a light quantity measuring sensor (sensor) 46 is provided instead of the image sensor 45. The light quantity measuring sensor 46 is a line sensor, and which includes a light emitting unit 46a and a light receiving unit 46b. The light quantity measuring sensor 46 is a transmission-type light measuring sensor. The light emitting unit 46a and a light receiving unit 46b are arranged at intervals in the vertical direction (thickness direction of the wafer 2) so as to sandwich the wafer 2. In the present embodiment, the light emitting unit 46a is on the upper side, but the light emitting unit 46a may be on the lower side.

The layout of the wafer 2 in the second embodiment is the same as that of the embodiment described above. In addition, the detection range A3 in the second embodiment is the same as the detection range A1 in the embodiment described above. The light emitting unit 46a irradiates an inspection light toward the light receiving unit 46b. Since the wafer 2 is located between the light emitting unit 46a and the light receiving unit 46b, the light receiving unit 46b receives the inspection light partially blocked by the wafer 2. The light receiving unit 46b transmits a current signal (or a voltage signal converted it) corresponding to the light quantity of the received inspection light to the controller 20. Although the current signal increases according to the light quantity of the received inspection light, it does not indicate the position where the inspection light is received.

A reflection-type light measuring sensor may be provided instead of the transmission-type light measuring sensor. In the reflection-type light measuring sensor, the light emitting unit and the light receiving unit are arranged on the same side with respect to the wafer 2. The light receiving unit receives a reflected light reflected by the wafer 2 from the inspection light emitted by the light emitting unit.

The second embodiment is an example in which the configuration provided with the light quantity measuring sensor 46 is applied to the embodiment described above. Instead of this, the configuration in which the light quantity measuring sensor 46 is provided can be applied to the first embodiment.

The alignment flow of the second embodiment will be described below. First, the conveyance control unit 21 controls the robot 1 to place the wafer 2 on the first rotating base 41b and the second rotating base 42b (S201), as in the embodiment described above. However, the robot 1 may perform alignment by placing the next wafer 2 on the second rotating base 42b, after performing alignment by placing wafer 2 on the first rotating base 41b.

As described above, since the light quantity measuring sensor 46 does not specify the position where the light receiving unit 46b receives the inspection light, the step of acquiring the rotation phase of the notch 2a needs to be performed for each wafer 2. And thus, the aligner control part 22 starts the measurement by the light quantity measuring sensor 46 while rotating the first rotating base 41b (without rotating the second rotating base 42b) (S202).

And next, the analysis unit 23 acquires and stores the rotation phase of the notch 2a of the wafer 2, based on the variation of a change quantity of an inspection light received by the light receiving unit 46b (the amplitude level of the current signal) (S203). Specifically, when the notch 2a is located on the detection range A3, the light quantity of the inspection light increases. Therefore, the analysis unit 23 acquires the rotation phase of the notch 2a of the wafer 2 placed on the first rotating base 41b, based on the current signal output by the light quantity measuring sensor 46 and the rotation phase of the first rotating base 41b.

Specifically, the rotation phase can be specified for the wafer 2 in which the orientation flat is formed instead of the notch 2a in the same way. In addition, when the positional deviation of the wafer 2 occurs, the light quantity received by the light receiving unit 46b always changes (regardless of the presence or absence of the notch 2a), so that the occurrence of that positional deviation can be specified. Moreover, the direction of the positional deviation can be specified based on the changing modes in the light quantity received by the light receiving unit 46b (based on the light quantity in each rotation phase).

Next, the aligner control part 22 adjusts the rotation phase of the wafer 2 placed on the first rotating base 41b (S204). That is, according to the rotation phase of the notch 2a specified by the analysis unit 23, the aligner control part 22 rotates the first rotating base 41b so that the notch 2a may be turned to a predefined direction, After that, the aligner control part 22 stops the rotation of the first rotating base 41b (S205). As described above, the alignment of the wafer 2 placed on the first rotating base 41b is completed. In the second embodiment, both wafers 2 are conveyed to the next step, after the alignment of both wafers 2 is completed. Instead of this, when the alignment of the wafer 2 placed on the first rotating base 41b is completed, and with which, before the alignment of the wafer 2 placed on the second rotating base 42*b* is started, the wafer 2 placed on the first rotating base 41*b* may be conveyed to the next step.

Next, perform alignment the wafer 2 placed on the second rotating base 42*b*. In addition, the wafer 2 can be placed on the second rotating base 42*b* at this timing. The method for performing alignment wafer 2 placed on the second rotating base 42*b* is the same as that of the first rotating base 41*b*. More specifically, the processing such as S206, S207, S208, and S209 is the same as the processing such as S202, S203, S204, and S205, respectively. And thus, the description of these steps is omitted.

After completion of the alignment with respect to the two wafers 2, the conveyance control unit 21 controls the robot 1 to conveys the wafer 2 placed on the first rotating base 41*b* and the second rotating base 42*b* to the destination (e.g., processing device in the next step) (S210).

By performing the above processing, it is possible to perform alignment the two wafers 2 according to the configuration provided with the light quantity measuring sensor 46. In the second embodiment, since the light quantity measuring sensor 46 is more inexpensive than the image sensor 45, the cost of the aligner apparatus 4 can be further reduced.

As described above, the aligner apparatus 4 of the embodiment described above and the Modification includes the first rotating base 41*b*, the second rotating base 42*b*, and the detection apparatus 43. The first rotating base 41*b* on which a wafer 2 placed thereon rotates around the first rotation axis line L1. The second rotating base 42*b* on which a wafer 2 placed thereon rotates around the second rotation axis L2 whose position is different from that of the first rotation axis line L1. The detection apparatus 43 includes one sensor (the image sensor 45 or the light quantity measuring sensor 46, the same applies hereinafter) for detecting the edge of the wafer 2, in the detection range of that sensor, an edge of the wafer 2 placed on the first rotating base 41*b* and an edge of the wafer 2 placed on the second rotating base 42*b* are included, and detects the edges of the two wafers 2.

In this result, the two wafers 2 can perform alignment using one sensor so that the cost of the aligner apparatus 4 can be reduced as compared with the configuration for providing the sensor for each wafer 2.

According to the aligner apparatus 4 of the embodiment described above and the first embodiment, the sensor is the image sensor 45 that acquires an image of the edge of the wafer 2. Specifically, the sensor may be the later-described optical position detection.

And thus, the orientation of the wafer 2 can be specified according to position of the edge of the wafer 2.

According to the aligner apparatus 4 of the embodiment described above and the first embodiment, while rotating both the first rotating base 41*b* and the second rotating base 42*b*, the image sensor 45 detects the edge of the wafer 2 placed on the first rotating base 41*b* and the edge of the wafer 2 placed on the second rotating base 42*b* simultaneously.

This causes per unit of time can be increased.

According to the aligner apparatus 4 of the second embodiment, the sensor is the light quantity measuring sensor 46 having the light emitting unit 46*a* and the light receiving unit 46*b*. The light emitting unit 46*a* irradiates an inspection light. The light receiving unit 46*b* receives that the reflected lights by the inspection light on the wafer 2 or lights in which part of the inspection light is blocked by the wafer 2.

In this result, it is possible to use cheaper sensor as compared with the image sensor 45, the cost of the aligner apparatus 4 can be reduced.

According to the aligner apparatus 4 of the second embodiment, during stopping of the rotating of the second rotating base 42*b* with rotating the first rotating base 41*b*, the light quantity measuring sensor 46 detects the edge of the wafer 2 placed on the first rotating base 41*b*. During stopping of the rotating of the first rotating base 41*b* with rotating the second rotating base 42*b*, the light quantity measuring sensor 46 detects the edges of the wafer placed on the second rotating base 42*b*.

This allows, two wafers 2 can be detected by one sensor in consideration of the characteristics of the light quantity measuring sensor 46.

According to the aligner apparatus 4 of the above-described embodiment and the Embodying Mode, the detection apparatus 43 detects the edge of the two wafers with the sensor position is fixed.

In the configuration detecting the edge of the wafer 2, the detection result changes as the sensor moves, so the detection result of the sensor needs to be corrected. On the other hand, by detecting the edge of the wafer 2 with the sensor position is fixed, this correction can be simplified or omitted.

According to the aligner apparatus 4 of the above-described embodiment and the second embodiment, in a plan view, the wafer 2 placed on the first rotating base 41*b* and the wafer 2 placed on the second rotating base 42*b* are separated from each other.

This allows, the work of removing the substrate 2 using the robot 1 becomes easy as compared with the case where the wafers 2 overlap each other in a plan view.

According to the aligner apparatus 4 of the above-described embodiment and the second embodiment, the height in the portion for placing the wafer 2 of the first rotating base 41*b* and the height in the portion for placing the wafer 2 of the second rotating base 42*b* are the same.

As a result, the height of the hand 12 when the wafer 2 is placed on the first rotating base 41*b* and the height of the hand 12 when the wafer 2 is placed on the second rotating base 42*b* are the same. Because of that, the movement of the hand 12 to the height direction can be reduced or eliminated.

According to the aligner apparatus 4 of the first embodiment, the height in the portion for placing the wafer 2 of the first rotating base 41*b* and the height in the portion for placing the wafer 2 of the second rotating base 42*b* are different. The wafer 2 placed on the first rotating base 41*b* and the wafer 2 placed on the second rotating base 42*b* overlap each other.

As a result, the installation area of the aligner apparatus 4 can be reduced.

The alignment method in this present embodiment includes a first detection step and a second detection step. In the first detection step, the edge of the wafer 2 placed on the first rotating base 41*b* that rotates around the first rotation axis line L1 is detected by the sensor (S103, S203). In the second detection step, simultaneously performing as the first detection step or after the first detection step, and the position of the sensor is the same as that of the first detection step, and the sensor detects the edge of the wafer 2 placed on the second rotating base 42*b* that rotates around the second rotation axis line different from the first rotation axis line (S103, S207).

While a preferred embodiment and variations of the present invention and Embodying Mode has been described above, the above configurations may be modified, for example, as follows.

It is not necessary to move the positions of the image sensor 45 and the light quantity measuring sensor 46 in the above-described embodiment. However, for example, for the adjustments of the detection range or other purposes, during preparation before alignment, the image sensor 45 and the light quantity measuring sensor 46 may be moved.

The flowchart shown in the above-described embodiment is only an example, and some steps may be omitted, or some details of step may be changed, or new step may be added. For example, in the flowchart of FIG. 10, the step S206 may be performed before the step S205 is completed. Still, in this case, the analysis unit 23 performs the analysis using the electric signal acquired after the first rotating base 41*b* is completely stopped.

According to the above-described embodiment, examples of the sensor, the image sensor 45 and the light quantity measuring sensor 46 are given. The sensor is not limited to these, and may be, for example, an optical position detection sensor. The optical position detection sensor detects the position and shape of the wafer 2 by, for example, irradiating a laser light in various directions and analyzing its reflected wave.

Instead of the configuration in which the base 10 is provided on the floor of the factory, the configuration in which the base 10 is provided on the ceiling surface (ceiling type) may be used.

The invention claimed is:

1. An aligner apparatus comprising:
   a first rotating base which rotates with a wafer placed thereon around a first rotation axis line,
   a second rotating base which rotates with a wafer placed thereon around a second rotation axis whose position is different from that of the first rotation axis line, and
   a detection device including one sensor which detects an edge of a wafer, and the detection range of the sensor including the edge of a wafer placed on the first rotating base and the edge of the wafer placed on the second rotating base, and detects these edges of the two wafers, wherein
   the sensor comprises an image sensor which acquires an image of an edge of the wafer or a sensor which optically detects a position of an edge of the wafer, and
   during rotating both the first rotating base and the second rotating base, the sensor detects the edge of the wafer placed on the first rotating base and the edge of the wafer placed on the second rotating base simultaneously.

2. The aligner apparatus according to claim 1, wherein
   the sensor is a light amount measuring sensor having a light emitting unit and a light receiving unit,
   the light emitting unit irradiates an inspection light, and the light receiving unit receives a light that is the inspection light reflected on the wafer or the light in which part of the inspection light is blocked by the wafer.

3. The aligner apparatus according to claim 2, wherein
   during stopping of the rotating of the second rotating base with rotating the first rotating base, the sensor detects the edge of the wafer placed on the first rotating base, and
   during stopping of the rotating of the first rotating base with rotating the second rotating base, the sensor detects the edge of the wafer placed on the second rotating base.

4. The aligner apparatus according to claim 1, wherein
   the detection device detects the edge of the two wafers with the sensor position is fixed.

5. The aligner apparatus according to claim 1, wherein
   in a plan view, the wafer placed on the first rotating base and the wafer placed on the second rotating base are separated from each other.

6. The aligner apparatus according to claim 1, wherein
   a height in a portion for placing the wafer of the first rotating base and a height in a portion for placing the wafer of the second rotating base are the same.

7. The aligner apparatus according to claim 1, wherein
   a height of a portion of the first rotating base on which the wafer is placed and a height of a portion of the second rotating base on which the wafer is placed are different,
   the wafer placed on the first rotating base and the wafer placed on the second rotating base overlap each other in a plan view.

8. An alignment method comprising:
   a first detection step which detects an edge of a wafer placed on a first rotating base that rotates around a first rotation axis line by a sensor; and
   a second detection step which performs simultaneously as the first detection step or after the first detection step, and a position of the sensor is the same as that of the first detection step, and the sensor detects the edge of the wafer placed on a second rotating base that rotates around a second rotation axis line different from the first rotation axis line, wherein
   the sensor comprises an image sensor which acquires an image of an edge of the wafer or a sensor which optically detects a position of an edge of the wafer, and
   during rotating both the first rotating base and the second rotating base, the sensor detects the edge of the wafer placed on the first rotating base and the edge of the wafer placed on the second rotating base simultaneously.

* * * * *